(12) United States Patent
Hu et al.

(10) Patent No.: US 8,115,203 B2
(45) Date of Patent: Feb. 14, 2012

(54) PHOTOCONDUCTORS FOR MID-/FAR-IR DETECTION

(75) Inventors: Juejun Hu, Cambridge, MA (US); Anuradha Agarwal, Weston, MA (US); Lionel C. Kimerling, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 12/359,513

(22) Filed: Jan. 26, 2009

(65) Prior Publication Data

US 2010/0187530 A1   Jul. 29, 2010

(51) Int. Cl.
*H01L 29/04* (2006.01)
*H01L 29/10* (2006.01)
*H01L 31/00* (2006.01)

(52) U.S. Cl. ............. 257/53; 257/E29.068; 257/E21.68; 438/94; 438/95

(58) Field of Classification Search .......... 257/53, 257/E29.068, E21.068; 438/94, 95
See application file for complete search history.

(56) References Cited

U.S. PATENT DOCUMENTS

| 4,520,380 | A | 5/1985 | Ovshinsky et al. |
| 5,264,699 | A | 11/1993 | Barton et al. |
| 5,457,337 | A | 10/1995 | Baron et al. |
| 6,465,786 | B1 | 10/2002 | Rhodes |
| 7,202,102 | B2 | 4/2007 | Yao |
| 2006/0091284 | A1* | 5/2006 | Viens et al. ............... 250/201.9 |

FOREIGN PATENT DOCUMENTS

| JP | 56107551 | 8/1981 |
| JP | 2008531997 | 8/2008 |

OTHER PUBLICATIONS

International Search Report issued in connection with corresponding PCT Application No. PCT/US2010/020996, mailed on Jul. 29, 2010.

* cited by examiner

*Primary Examiner* — Jarrett Stark
(74) *Attorney, Agent, or Firm* — Gesmer Updegrove LLP

(57) ABSTRACT

An infrared photodiode structure is provided. The infrared photodiode structure includes a doped semiconductor layer having ions of certain conductivity. An active photodetecting region is positioned on the doped semiconductor layer for detecting an infrared light signal. The active photodetecting region includes one or more amorphous semiconductor materials so as to allow for high signal-to-noise ratio being achieved by invoking carrier hopping and band conduction, under dark and illuminated conditions.

5 Claims, 4 Drawing Sheets

PHOTOCONDUCTORS FOR MID-/FAR-IR DETECTION

BACKGROUND OF THE INVENTION

The invention is related to the field of photodetectors, and in particular to photoconductors for mid-/far-IR detection.

To date, most photodetectors that sense in the mid-/far-IR wavelength range are photodiodes made of single-crystals such as HgCdTe, InSb or multiple quantum wells. The low defect density in single crystals minimizes carrier recombination, and thus improves photodiode responsivity. However, the drawback of these crystalline alloys is the difficult and expensive material and device fabrication technology for large-area detectors, which require tight material and mechanical specifications and extensive molecular beam epitaxy (MBE) expertise and proofing.

SUMMARY OF THE INVENTION

According to one aspect of the invention, there is provided an infrared photodiode structure. The infrared photodiode structure includes a doped semiconductor layer having ions of certain conductivity. An active photodetecting region is positioned on the doped semiconductor layer for detecting an infrared light signal. The active photodetecting region includes one or more amorphous semiconductor materials so as to allow for high signal-to-noise ratio being achieved by invoking carrier hopping and band conduction, under dark and illuminated conditions.

According to another aspect of the invention, there is provided a method of forming an infrared photodiode structure. The method includes providing a doped semiconductor layer comprising of ions of certain conductivity. Also, the method includes positioning an active photodetecting region on the doped semiconductor layer for detecting an infrared light signal. The active photodetecting region includes one or more amorphous semiconductor materials so as to allow for high signal-to-noise ratio being achieved by invoking carrier hopping and band conduction, under dark and illuminated conditions.

DETAILED DESCRIPTION OF THE INVENTION

The invention proposes the use of amorphous alloys as efficient photoconductive detector materials. Amorphous photoconductive alloys such as As—Se—Te—Cu can be deposited using low-cost thermal evaporation or sputtering technique. Processing of these materials is compatible with current Si-CMOS back-end processes, and thus significant cost reduction can be achieved by leverage on the present Si VLSI technology. On the device performance side, two distinctive conduction mechanisms, namely carrier hopping and band conduction are found to be dominant in the amorphous alloys under dark and illuminated conditions, respectively, which leads to a high signal-to-noise ratio (SNR) of photoconductive detectors.

Figure 1:
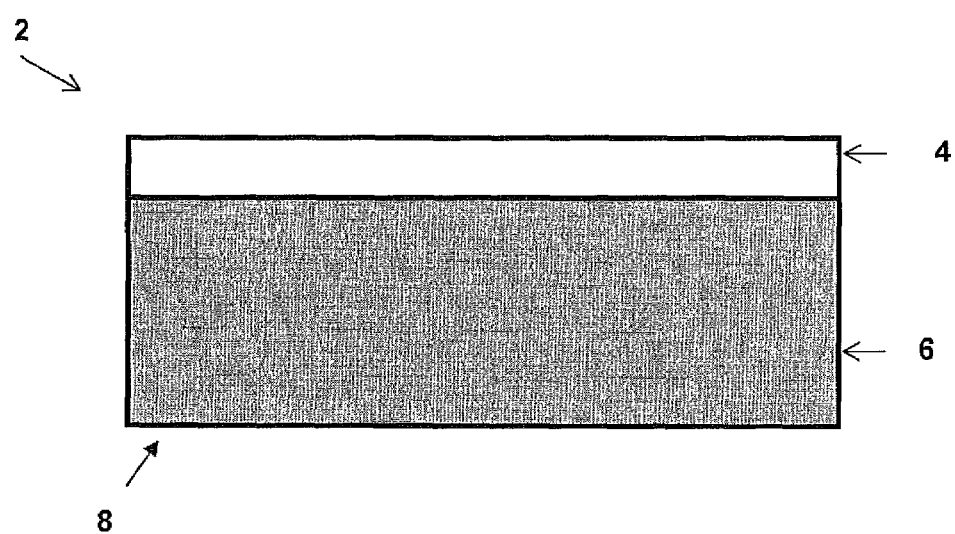
FIG. 1 is a schematic diagram illustrating a photodiode used in accordance with the invention.

FIG. 1 illustrates a photodiode used in accordance with the invention. The photodiode 2 includes a substrate 8 comprising amorphous semiconductor materials. The substrate 8 has p-type conductivity. Using standard techniques in the art, the substrate 8 is implanted with selective ions to form an n-type region 4 on the substrate 8. The remaining portion 6 of substrate 8 is not implanted and forms the active photodetecting region of the photodiode 2 for detecting an infrared light signal. The regions 4 and 6 form a heterojunction. In other embodiments, the substrate can be doped with n-type conductivity with a p-type region being formed using implantation of selective ions. The amorphous semiconductor materials can include amorphous photoconductive alloys like chalcogenide glass alloys having an alloy arrangement of As—Se—Te—Cu. Using amorphous semiconductor materials allow for high signal-to-noise ratio being achieved by invoking two distinctive conduction mechanisms, namely carrier hopping and band conduction, under dark and illuminated conditions.

Figure 2:
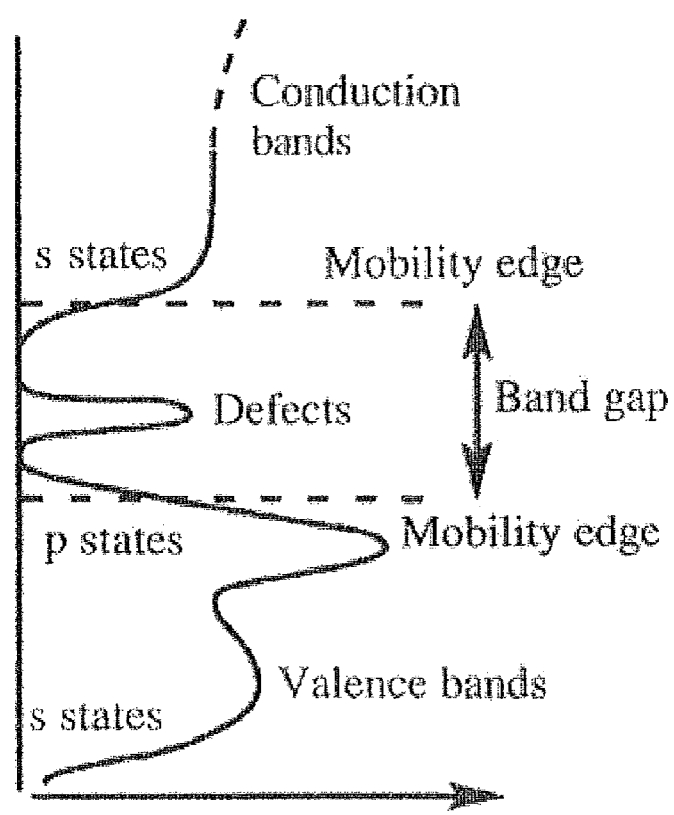
FIG. 2 is a graph illustrating density of states (DOS) function in amorphous semiconductors, featuring the presence of defect states near mid-bandgap and mobility edges which separate extended and localized states.

According to the well-known Mott-Davis model, density of states (DOS) in amorphous semiconductors is schematically represented in FIG. 2. The DOS function has two distinct features compared to their crystalline counterparts: i) The appearance of mobility edges which separate extended states in the bands from the localized states within the bandgap; ii) The existence of electronic states in mid-bandgap region due to coordination defects, for example, dangling bonds. Extended states in the bands contribute to the electrical conductivity through band conduction, similar to electronic conduction in crystalline semiconductors, and mid-gap defects contribute to the electrical conductivity by carrier hopping from one defect site to another.

Figure 3:
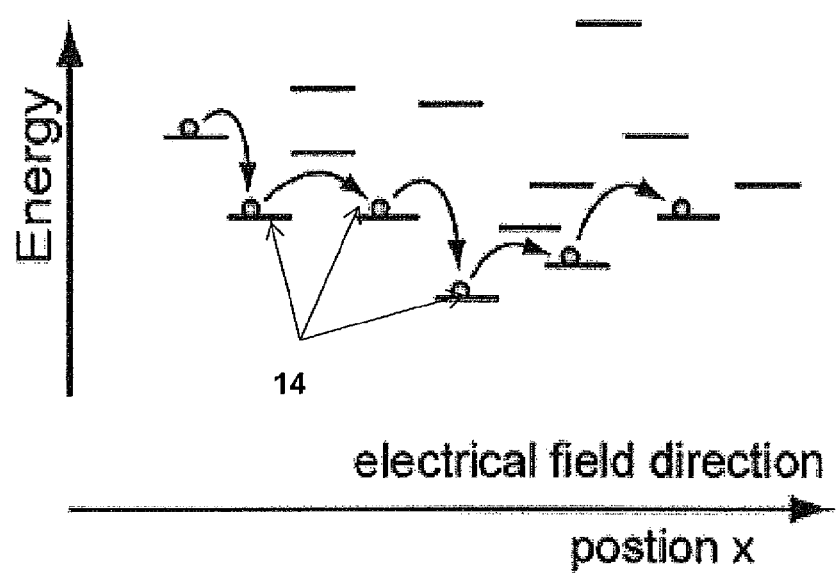
FIG. 3 is a schematic diagram illustrating carrier hopping conduction in amorphous semiconductors, which is a low mobility process.

Band conduction usually features high mobility, since the movement of electrons or holes in the bands is only limited by scattering events; In contrast, during hopping, thermal excitation or quantum tunneling between defect sites 14 is necessary to obtain mobile carriers because such carriers have to overcome significant energy barriers, as shown in FIG. 3. Hopping is characterized by low mobility and hence low conduction. Conductivity $\sigma$ in semiconductors is related to carrier mobility $\mu$ by:

$$\sigma = \sum_i N_i q \mu_i \qquad \text{EQ. 1}$$

in which $N_i$ is the concentration of the i'th carrier and q is the carrier charge. Thus higher mobility suggests higher conductivity for the same concentration of carriers.

The invention capitalizes on the difference between carrier mobility in the two conduction regimes to achieve high signal-to-noise ratio in photoconductive detectors. In amorphous solids, the existence of high concentration of coordination defects leads to the dominance of hopping even in room temperature. When illuminated, carriers localized near the defects 14 can be excited into conduction band via absorption of photons. The consequence of the photo excitation process is the presence of non-equilibrium carriers. Unlike carriers localized near defects, these photo-generated carriers are delocalized before they recombine and thus have high mobility, which leads to a large change in conductivity of the semiconductor material.

Figure 4A:
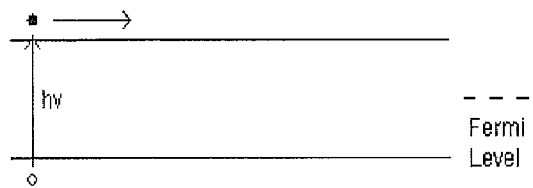
FIGS. 4A-4B are schematic diagrams illustrating the photoconductive process in amorphous and crystalline semiconductors.
Figure 4B:
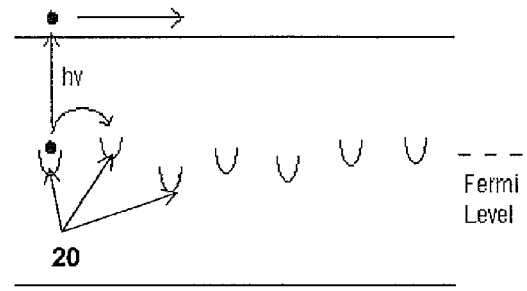

A schematic illustration comparing the photoconductive process in amorphous and crystalline semiconductors is shown in FIGS. 4A-4B. FIG. 4A illustrates the photoconductivity in crystalline semiconductors. Electron-hole pairs are generated by photon absorption and contribute to photoconductivity. In crystalline semiconductors, both, conduction in the dark and under illumination is carried out by delocalized carriers in the bands. The energy of the absorbed incident photons corresponds to the energy difference between conduction and valence bands.

FIG. 4B illustrates photoconductivity in amorphous semiconductors. Dark conductivity takes place via low-mobility carrier hopping and thus dark conductivity in amorphous solids is much smaller than dark conductivity in crystalline semiconductors. Upon illumination, generated photo carriers are promoted into the conduction band and hence have high mobility, which guarantees a high photocurrent signal for photoconductors. The energy of the incident photons equals the energy difference between Fermi level and defect levels 20, for example, about half of the bandgap in the case shown in FIG. 4B.

Band conduction and hopping exhibit different temperature dependence and thus conduction mechanisms in semiconductors can be experimentally verified by measuring conductivity vs. temperature. Band conduction is characterized by the Arrhenius equation: $\sigma = \sigma_1 [\exp(\Delta E/kT)]^{-1}$, where $\Delta E$ represents thermal excitation energy (equals the energy difference between Fermi level and band edge in the case of crystalline semiconductors) and k is the Boltzmann constant. Variable range hopping is featured by the well-known $T^{-1/4}$ law: $\sigma = \sigma_0 \exp(T_0/T)^{-1/4}$ where $\sigma$ and T represent electrical conductivity and temperature in Kelvin respectively, and $\sigma_0$ and $T_0$ are two constants that relate material band structures to electrical properties.

Although the present invention has been shown and described with respect to several preferred embodiments thereof, various changes, omissions and additions to the form and detail thereof, may be made therein, without departing from the spirit and scope of the invention.

What is claimed is:

1. An infrared photodiode structure comprising:
    a doped semiconductor layer comprising of ions of certain conductivity, wherein said doped semiconductor layer is an implanted region formed on a substrate structure of opposite conductivity than said doped semiconductor layer; and
    an active photodetecting region positioned on said doped semiconductor layer for detecting an infrared light signal, said active photodetecting region comprising one or more amorphous semiconductor materials so as to allow for high signal-to-noise ratio being achieved by invoking carrier hopping and band conduction, under dark and illuminated conditions, said one or more amorphous semiconductor materials having a plurality of defects leading to the carrier hopping at room temperature, when illuminated, these carriers are localized near said defects and are excited into band conduction via absorption of photons, the carriers are delocalized before they recombine, which leads to changes in the conductivity of the one or more amorphous semiconductor materials, said active photodetecting region being the remaining region of the substrate structure where said active photodetecting region and said doped semiconductor layer form a heterojunction.

2. The infrared photodiode structure of claim 1, wherein said one or more amorphous semiconductor materials comprise chalcogenide glass alloys.

3. The infrared photodiode structure of claim 2, wherein said chalcogenide glass alloys comprise As—Se—Te—Cu material composition.

4. The infrared photodiode structure of claim 1, wherein said carrier hopping takes place between defect sites in said one or more amorphous semiconductor materials.

5. The infrared photodiode structure of claim 1, wherein said one or more amorphous semiconductor materials comprise defects originate from either structural disorder or coordination defects.

* * * * *